United States Patent
Tailliet

(10) Patent No.: US 7,692,906 B2
(45) Date of Patent: Apr. 6, 2010

(54) DEVICE FOR PROTECTING AN INTEGRATED CIRCUIT AGAINST LATCH-UP PHENOMENA

(75) Inventor: François Tailliet, Fuveau (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 11/626,086

(22) Filed: Jan. 23, 2007

(65) Prior Publication Data
US 2007/0188961 A1   Aug. 16, 2007

(51) Int. Cl.
| H02H 9/00 | (2006.01) |
| H02H 3/00 | (2006.01) |
| H02H 3/20 | (2006.01) |
| H02H 9/04 | (2006.01) |
| H02H 3/27 | (2006.01) |
| H02H 3/08 | (2006.01) |
| H02H 9/02 | (2006.01) |
| H02H 9/08 | (2006.01) |

(52) U.S. Cl. .......................... 361/56; 361/87; 361/91.1; 361/91.3; 361/91.5; 361/93.1; 361/93.9; 361/94

(58) Field of Classification Search .................. None
See application file for complete search history.

(56) References Cited

U.S. PATENT DOCUMENTS

| 5,212,616 | A | 5/1993 | Dhong et al. ............... 361/18 |
| 5,977,815 | A | 11/1999 | Scoones et al. ............ 327/530 |
| 6,717,785 | B2* | 4/2004 | Fukuda et al. ............. 361/93.1 |
| 7,253,999 | B2* | 8/2007 | Ker et al. ..................... 361/56 |
| 2002/0020881 | A1* | 2/2002 | Okawa ........................ 257/361 |
| 2003/0222703 | A1 | 12/2003 | Ker et al. .................... 327/379 |
| 2005/0085028 | A1* | 4/2005 | Chatty et al. ............... 438/200 |
| 2007/0091526 | A1* | 4/2007 | Steinhoff et al. ............. 361/56 |

FOREIGN PATENT DOCUMENTS

| EP | 0 391 672 | 10/1990 |
| EP | 0 827 206 | 3/1998 |
| JP | 03106068 | 5/1991 |
| JP | 06273481 | 9/1994 |
| WO | 02/00004 | 1/2002 |

* cited by examiner

*Primary Examiner*—Albert W Paladini
*Assistant Examiner*—Dharti H Patel
(74) *Attorney, Agent, or Firm*—Lisa K. Jorgenson; Eric M. Ringer; Seed IP Law Group PLLC

(57) ABSTRACT

Device for protecting an integrated circuit, comprising a device for detecting a latch-up condition, and a supply voltage control device for controlling a supply voltage of the integrated circuit, to modify a parameter of the supply voltage of the integrated circuit in order to prevent the latch-up from becoming permanently established.

36 Claims, 7 Drawing Sheets

US 7,692,906 B2

DEVICE FOR PROTECTING AN INTEGRATED CIRCUIT AGAINST LATCH-UP PHENOMENA

BACKGROUND OF THE INVENTION

1. Field of the Invention

The present invention relates to integrated circuits and more particularly to the protection of integrated circuits against so-called "latch-up" phenomena.

It applies mainly, but not exclusively, to CMOS-type (Complementary Metal-Oxide Semiconductor) integrated circuit technologies that are particularly sensitive to this phenomenon.

2. Description of the Related Art

The latch-up phenomenon manifests itself in an inrush current linked to the triggering of a parasitic thyristor structure inherent in certain integrated circuit technologies, and in particular in the CMOS-type technologies.

The MOS transistor-based architectures have parasitic bipolar transistors the gain of which can be very high (50 to 100). Therefore, the parasitic transistors do not disrupt the operation of the circuit, except in certain parasitic thyristor-type configurations (PNPN) in which two parasitic bipolar transistors work in positive feedback, forming a bistable configuration which can be triggered by slight disturbance. Once the feedback is established, the thyristor is in a high conduction state that powers itself even after the disappearance of the disturbance, due to the fact that the thyristor is placed directly in parallel on the power supply. This state can therefore prove destructive for the integrated circuit.

Such a parasitic thyristor configuration is shown in FIG. 1 that represents in a cross-section the structure of a CMOS integrated circuit cell, comprising for example a logic gate such as an inverter.

The integrated circuit IC cell represented in FIG. 1, of P-substrate and N-well type, comprises two N- and P-channel MOS transistors, produced in a P--doped semi-conductive substrate 1. The P-channel MOS transistor is formed in an N--doped region 2 of the substrate, referred to as a "well". The well comprises a drain region 3, a source region 4, these regions being P+ doped, and an N+-doped region 5. The regions 3, 4 that delimit the channel of the P-channel MOS transistor, are respectively connected to an output 10 of the cell and to the supply terminal Vdd. The region 5 receives the supply voltage Vdd. The N-channel MOS transistor is formed in the substrate 1 by a source region 7, a drain region 8, these regions being N+-doped and delimiting the channel of the N-channel MOS transistor, and a P+-doped region 6 connected to the ground. The regions 7, 8 are respectively connected to the ground terminal and to the output 10 of the cell.

Layers 9, for example in polysilicon, formed above the channels N and P of the two transistors, constitute the gates thereof and are connected to the input 11 of the integrated circuit cell.

FIG. 1 also represents, in thinner lines, the position of the parasitic thyristor in relation to the doped regions forming the two transistors MOS. The parasitic thyristor is formed by two bipolar transistors T1 of pnp-type and T2 of npn-type, mounted head-to-tail, the collector of one being connected to the base of the other, while the emitters of the two transistors T1, T2 are respectively connected to the supply terminal Vdd and to the ground of the circuit. The emitter-base junction of the transistor T1 is formed by the association of the P+-doped 4 and N--doped 2 regions, whereas the collector-base junction of this transistor is formed by the association of the P--doped substrate 1 and of the N--doped region 2. The supply terminal Vdd of the circuit is therefore connected to the emitter of the transistor T1, and linked to the base of this transistor through a resistor RN– representing the resistance of the well 2. The base-emitter junction of the transistor T2 is formed by the association of the substrate 1 and of the N+-doped region 7 linked to the ground, while the base-collector junction of this transistor is formed by the association of the substrate 1 and of the region 2. The ground is therefore connected to the base of the transistor T2, and linked to the emitter of this transistor through a resistor RP– representing the resistance of the substrate 1.

The parasitic thyristor can be triggered by an overvoltage applied to the power supply of the integrated circuit, a negative voltage or an overvoltage applied to an input and/or output terminal of the integrated circuit, a current injection into an input or output terminal of the integrated circuit, or even by radiations of particles. This triggering produces a strong inrush current between the supply terminals of the integrated circuit, that can cause the destruction of the integrated circuit.

The specifications of integrated circuits require a minimum injected current, for example 100 mA at the maximum operating temperature (generally between 70 and 150° C.).

The sensitivity of an integrated circuit to the latch-up can be measured by injecting a current into an input or output pin of the integrated circuit, while the latter is powered normally, by detecting an over-consumption of current in the power supply, that can be more or less sudden, and by measuring the intensity of the current injected upon the appearance of the over-consumption. If the over-consumption detected stops at the same time as the current injection, the latch-up is said to be temporary. If, on the contrary, this over-consumption remains even after the current injection has stopped, the latch-up is said to be permanent. A circuit is considered insensitive to latch-up if the latter is only temporary or if a permanent latch-up only appears with an injected current having a high intensity.

There are several techniques for reducing the sensitivity of the components to latch-up, i.e., for reducing the performances of the parasitic thyristor and the value of the resistors RN– and RP– of the base of the two parasitic transistors T1, T2.

A first technique involves applying specific routing rules, and particularly adding many N and P bias regions, such as the regions 5, 6 in FIG. 1, and increasing the distance between the P- and N-channel MOS transistors. This technique runs counter to the miniaturization of integrated circuits.

Another technique involves using epitaxial substrates, so as to reduce the base resistance of one of the two parasitic transistors, i.e., in the example in FIG. 1, the resistor RP– of the base of the transistor T2. This technique involves using more expensive silicon wafers.

The base resistance of the transistors T1, T2 can also be reduced using wells made deep in the substrate and highly doped. This technique also contributes to increasing the manufacturing costs, due to the fact that it requires adding or modifying several manufacturing masks of the integrated circuit, and increases the number of manufacturing steps.

In addition, the techniques presented above are not always infallible.

BRIEF SUMMARY OF THE INVENTION

One embodiment of the present invention provides a method for protecting an integrated circuit. The method comprises steps of detecting a latch-up condition, and if a latch-up condition is detected, of modifying a supply voltage parameter of the integrated circuit, to prevent the latch-up from becoming permanently established.

According to one embodiment of the present invention, the detection of a latch-up condition comprises a step of detecting a current injection into a connection terminal of the integrated circuit.

According to one embodiment of the present invention, the detection of a current injection into a connection terminal of the integrated circuit comprises detecting a positive current injection into the connection terminal.

According to one embodiment of the present invention, the detection of a current injection into a connection terminal of the integrated circuit comprises detecting a negative current injection into the connection terminal.

According to one embodiment of the present invention, the detection of a current injection into a connection terminal of the integrated circuit comprises detecting a current in a diode formed near the connection terminal.

According to one embodiment of the present invention, the detection of a current injection into a connection terminal of the integrated circuit comprises applying a time delay upon the detection of a current injection, and taking the detection of a current injection into account if the current injection is still detected at the end of the time delay.

According to one embodiment of the present invention, the detection of a latch-up condition comprises detecting an overvoltage appearing in a power supply connection terminal of the integrated circuit.

According to one embodiment of the present invention, the modification of a supply voltage parameter of the integrated circuit comprises cutting off the supply voltage of the integrated circuit while a latch-up condition is present.

According to one embodiment of the present invention, the modification of a supply voltage parameter of the integrated circuit comprises stepping down the supply voltage of the integrated circuit while a latch-up condition is present.

According to one embodiment of the present invention, the modification of a supply voltage parameter of the integrated circuit comprises supplying the supply voltage of the integrated circuit through a resistor while a latch-up condition is present.

One embodiment of the present invention is a device for protecting an integrated circuit. The protection device comprises a latch-up condition detection device for detecting a latch-up condition, and a supply voltage control device for controlling the supply voltage of the integrated circuit, to modify a parameter of the supply voltage of the integrated circuit in order to prevent the latch-up from becoming permanently established.

According to one embodiment of the present invention, the latch-up condition detection device comprises a current injection detector circuit for detecting a current injection into a connection terminal of the integrated circuit.

According to one embodiment of the present invention, the latch-up condition detection device comprises a negative current injection detector circuit for detecting a negative current injection into a connection terminal of the integrated circuit.

According to one embodiment of the present invention, the latch-up condition detection device comprises a positive current injection detector circuit for detecting a positive current injection into a connection terminal of the integrated circuit.

According to one embodiment of the present invention, the current injection detector circuit comprises a diode formed near the connection terminal and a measuring circuit for measuring the current passing through the diode.

According to one embodiment of the present invention, the latch-up condition detection device comprises, for each connection terminal of the integrated circuit, a detector circuit for detecting a negative current injection into the connection terminal, and/or a detector circuit for detecting a positive current injection into the connection terminal.

According to one embodiment of the present invention, the latch-up condition detection device comprises a time delay circuit to take into account a detection of current injection into a connection terminal of the integrated circuit, only if a current injection is still detected at the end of a time delay.

According to one embodiment of the present invention, the latch-up condition detection device comprises a detector circuit for detecting an overvoltage appearing in a power supply connection terminal of the integrated circuit.

According to one embodiment of the present invention, the supply voltage control device comprises means for cutting off the supply voltage of the integrated circuit while a latch-up condition is present.

According to one embodiment of the present invention, the supply voltage control device comprises a voltage step-down transformer for stepping down the supply voltage of the integrated circuit while a latch-up condition is present.

According to one embodiment of the present invention, the supply voltage control device comprises a resistor through which the supply voltage is supplied to the integrated circuit while a latch-up condition is present.

According to one embodiment of the present invention, the supply voltage control device comprises a voltage regulator that steps down the supply voltage of the integrated circuit to a minimum value while a latch-up condition is present.

The present invention also relates to an integrated circuit comprising a protection device as defined above.

One embodiment of the present invention is a latch-up condition detection device for detecting a latch-up condition in an integrated circuit. The device comprises a detector circuit for detecting a current injection into a connection terminal of the integrated circuit.

According to one embodiment of the present invention, the current injection detector circuit detects a negative current injection.

According to one embodiment of the present invention, the current injection detector circuit detects a positive current injection.

According to one embodiment of the present invention, the current injection detector circuit comprises a diode formed near the connection terminal and a measuring circuit for measuring the current passing through the diode.

According to one embodiment of the present invention, the detection device comprises for each connection terminal of the integrated circuit, a detector circuit for detecting a negative current injection into the connection terminal, and/or a detector circuit for detecting a positive current injection into the connection terminal.

According to one embodiment of the present invention, the detection device comprises a time delay circuit to take into account a detection of current injection into a connection terminal of the integrated circuit, only if a current injection is still detected at the end of a time delay.

According to one embodiment of the present invention, the detection device comprises a detector circuit for detecting an overvoltage appearing in a power supply connection terminal of the integrated circuit.

The present invention also relates to an integrated circuit comprising a detection device as defined above.

BRIEF DESCRIPTION OF THE SEVERAL VIEWS OF THE DRAWINGS

These and other features and advantages of the present invention will be explained in greater detail in the following description of embodiments of the present invention, given in relation with, but not limited to the following figures, in which.

DETAILED DESCRIPTION OF THE INVENTION

Figure 2:
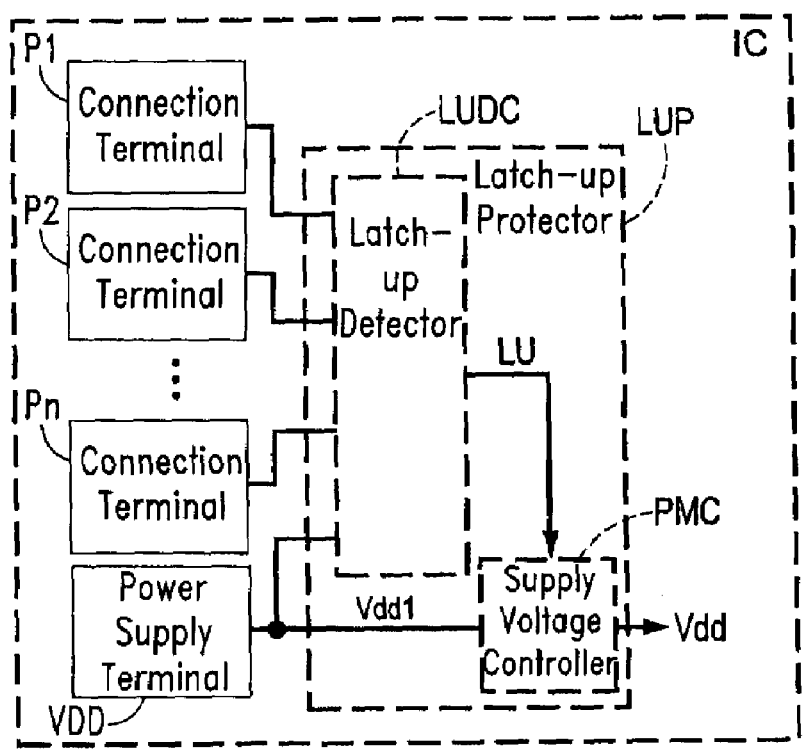
FIG. 2 represents in block form an integrated circuit equipped with a protection device according to the present invention.

FIG. 2 represents an integrated circuit IC comprising input and/or output connection terminals P1, P2, ..., Pn and a power supply connection terminal VDD of the integrated circuit.

According to one embodiment of the present invention, the integrated circuit IC comprises a latch-up protection device LUP. The device LUP comprises a device LUDC for detecting latch-up generating conditions and a supply voltage control circuit PMC for controlling the supply voltage Vdd of the integrated circuit. The device LUDC supplies a detection signal LU that is used by the circuit PMC to control the supply voltage Vdd supplied to the other functions of the integrated circuit.

Figure 3:
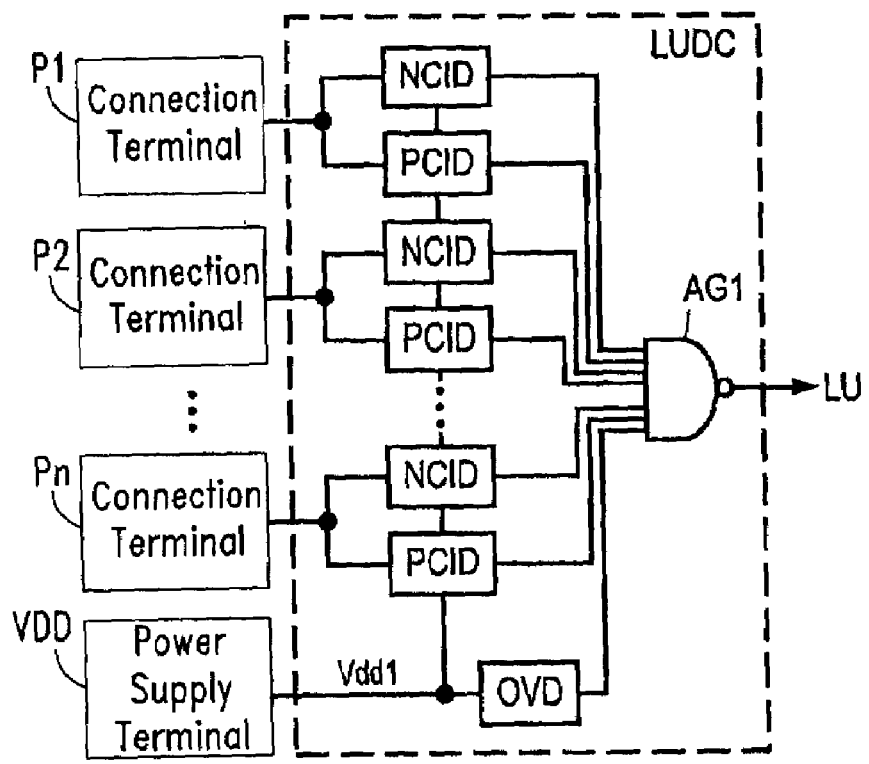
FIG. 3 represents in block form a latch-up condition detection device of the protection device according to the present invention.

FIG. 3 represents a detection device LUDC according to one embodiment of the present invention, supplying the integrated circuit IC with a detection signal LU of at least one latch-up generating condition.

The detection device LUDC comprises a positive current injection detector circuit PCID and/or a negative current injection detector circuit NCID, connected to each connection terminal of the set of input and/or output connection terminals P1-Pn of the integrated circuit IC, and/or an overvoltage detector circuit OVD connected to the power supply connection terminal VDD of the integrated circuit.

The device LUDC comprises NAND gate AG1 connected to the outputs of the circuits NCID, PCID and OVD. The output of the gate AG1 supplies the detection signal LU.

The detector circuit LUDC is powered by a voltage Vdd1 coming directly from the power supply connection terminal VDD of the integrated circuit IC.

If no latch-up condition is detected, all the signals applied at input of the gate AG1 are on 1, and therefore the output signal of the device LUDC is on 0. On the contrary, if at least one signal at input of the gate AG1 is on 0, the signal LU is on 1 indicating that a latch-up condition of the integrated circuit has been detected.

Figure 4:
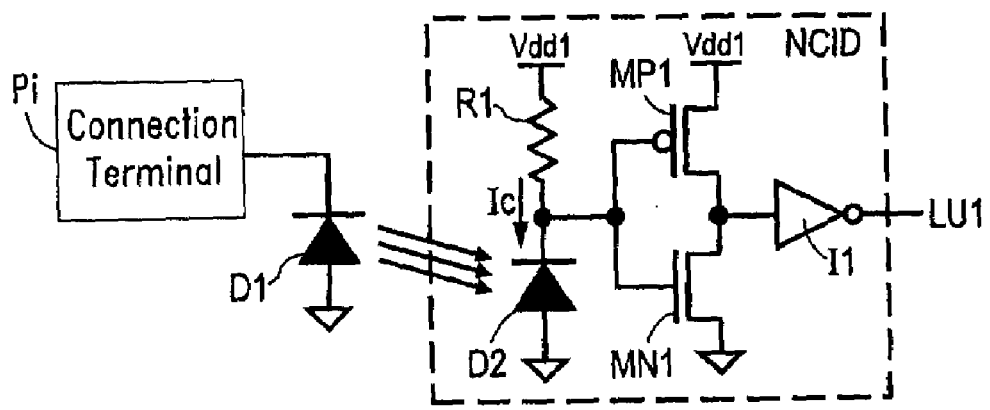
FIG. 4 is a wiring diagram of a detector circuit according to the present invention, for detecting a negative current injection on a connection terminal of the integrated circuit.

FIG. 4 represents a detector circuit for detecting a negative current injection NCID into a connection terminal Pi of an integrated circuit.

Figure 1:
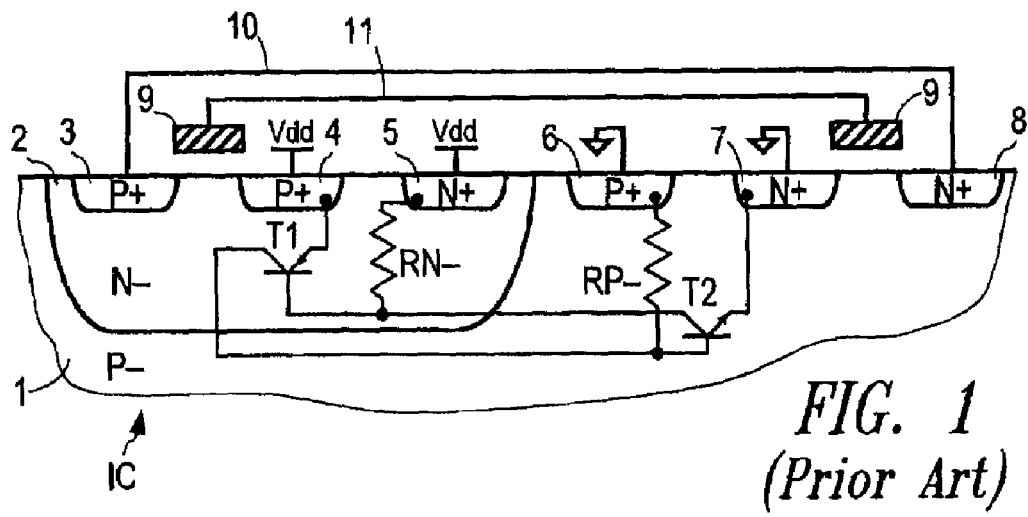
FIG. 1 already described represents in a cross-section an integrated circuit in which a latch-up is likely to occur.

It is generally possible to inject a current that is negative in relation to the ground through an N+-doped region formed in a P substrate, and connected to the ground, for example the region 7 in the diagram in FIG. 1. Such a region forms a parasitic diode D1 reverse-connected between the connection terminal Pi of the integrated circuit and the ground. In addition, the diode D1 is sometimes added to provide ESD protection (electrostatic discharge) in the event that the terminal Pi forms an input and/or output or a supply terminal of the integrated circuit.

In FIG. 4, the detector circuit NCID comprises a reverse-mounted diode D2 disposed near the diode D1. The anode of the diode D2 is connected to the ground. The cathode of the diode D2 is connected to the input of an inverter comprising a P-channel MOS transistor MP1 and an N-channel MOS transistor MN1, and is linked to the power supply source Vdd1 of the integrated circuit through a resistor R1. The input of the inverter is connected to the gates of the transistors MP1 and MN1. The source of the transistor MP1 receives the supply voltage Vdd1. The source of the transistor MN1 is connected to the ground. The drains of the transistors MP1 and MN1 are connected to the input of another inverter I1 the output of which is the output of the circuit NCID that supplies a detection signal of a negative current injection LU1.

Figure 5:
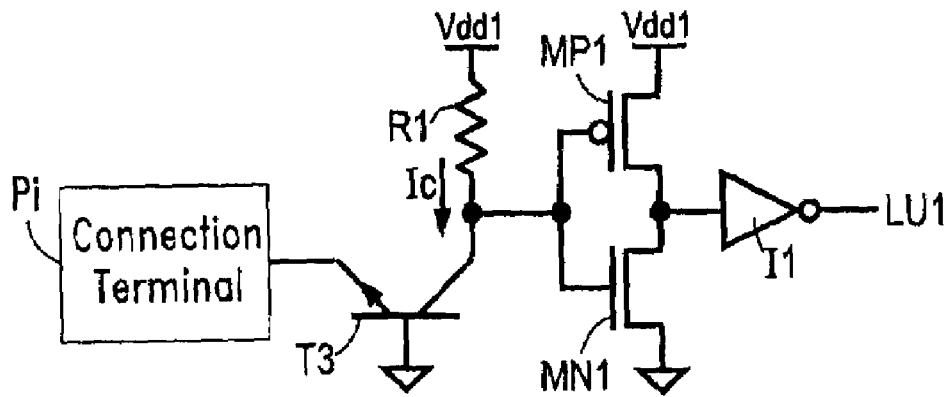
FIG. 5 is an equivalent wiring diagram of the detector circuit represented in FIG. 4.

The circuit NCID in FIG. 4 is equivalent to the circuit represented in FIG. 5. In the circuit in FIG. 5, the diodes D1 and D2 have been replaced by an NPN-type bipolar transistor T3 equivalent to the diodes D1, D2. The emitter of the transistor T3 is connected to the connection terminal Pi, the base of the transistor T3 is grounded, and the collector of the transistor T3 is connected to the resistor R1 and to the gates of the transistors MP1 and MN1. In other words, the diodes D1 and D2 are sufficiently near one another to form the junctions NP and PN of a bipolar transistor. The diode D2 that is thus added to detect a current injection, forms the collector-base junction of the transistor T3, while the diode D1 forms the emitter-base junction of the transistor T3.

The intensity of the current Ic circulating in the collector of the transistor T3, i.e., in the detection diode D2, varies according to the total current injected into the ground of the substrate of the integrated circuit by the connection terminal Pi. The law of variation of the intensity of the current Ic depends on the gain of the transistor T3, and in particular on the distance between the collector and the point of injection of the current, and on the shape and the dimensions of the collector. Due to these distance, shape and dimensional characteristics (lateral bipolar transistor with a long base zone), the gain of the transistor T3 is typically lower than 1. The value of the resistor R1 is chosen according to the current intensity threshold to be detected. Typically, the value of the resistor R1 is of a few kilo-Ohms.

The transistors MP1 and MN1 are preferably designed so that the W/L ratio (channel width-to-length ratio) of the transistor MP1 is clearly greater than the ratio of the transistor MN1. Thus, the inverter made up of the transistors MP1 and MN1 switches when its input voltage is lower than or equal to Vdd1−Vtp, Vtp being the threshold voltage of the transistor MP1. The detection signal LU1 at output of the circuit NCID, normally on 1, thus goes to 0 if the following relation is confirmed:

$$R1 \cdot Ic \geq |Vtp| \tag{1}$$

i.e., if the current Ic collected by the diode D2 is greater than or equal to Vtp/R1.

Without this dimensioning constraint of the transistors MP1 and MN1, the switching threshold of the inverter made up of the transistors MP1 and MN1 depends on the voltage Vdd.

Figure 6:
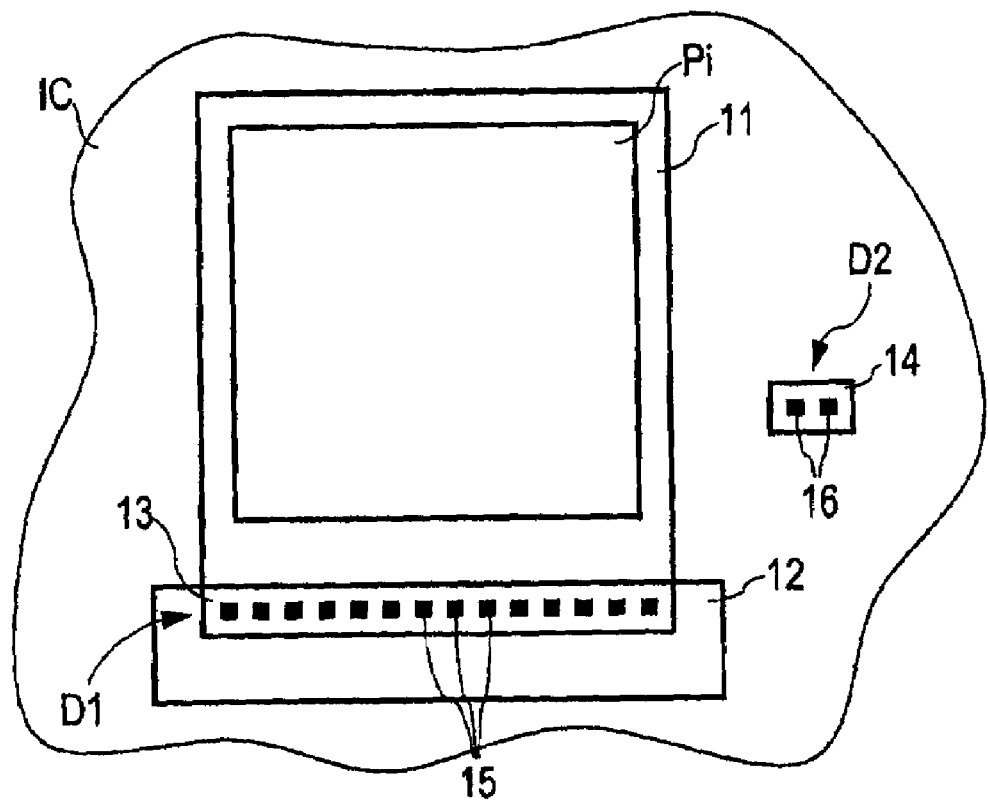
FIG. 6 is a simplified partial top view of the integrated circuit equipped with a detection means of the circuit represented in FIG. 4.

The notion of proximity of the diodes D1 and D2 is shown in FIG. 6 which represents in a top view a portion of the active face of the integrated circuit IC comprising the connection terminal Pi. The connection terminal Pi is produced by metallization 11 forming a contact pad deposited on the active face of the integrated circuit IC, and connected to at least one highly N+-doped region 12. In FIG. 6, the contours of the contact pad Pi correspond to a zone of the active face of the integrated circuit not covered by a passivation insulator. The connection zone 13 of the zone 12 doped by the metallization 11 is linked to the latter by a plurality of contacts 15, particularly so as to enable a high current density. The interface between the doped zone 12 and the P doping substrate, forms the diode D1 that is connected to the contact pad Pi.

The diode D2 is produced near the diode D1 by forming an N+-doped region 14, and by forming contacts 16 so as to be able to connect the diode to the rest of the circuit.

The distance between the diodes D1 and D2 is determined according to the duration of the current injection to be detected and to the speed of propagation of the loads thus injected into the integrated circuit.

Figure 7:
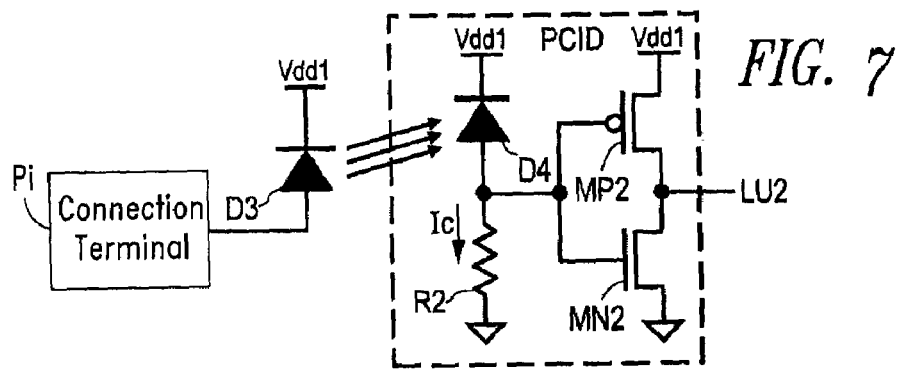
FIG. 7 is a wiring diagram of a detector circuit according to the present invention, for detecting a positive current injection on a connection terminal of the integrated circuit.

FIG. 7 represents a detector circuit PCID for detecting a positive current injection into a connection terminal Pi of the integrated circuit. It is generally possible to inject a current that is positive in relation to the supply voltage Vdd1 through a P+-doped region formed in an N-well, and connected to the supply voltage source, for example the region 4 in the diagram in FIG. 1. Such a region forms a parasitic diode D3 reverse-connected between the connection terminal Pi of the integrated circuit and the power supply source Vdd1. In addition, the diode D3 is also sometimes added to provide ESD protection in the event that the terminal Pi forms an output of the integrated circuit.

As in the circuit NCID represented in FIG. 4, the detector circuit PCID in FIG. 7 comprises a reverse-mounted diode D4 disposed near the diode D3. The anode of the diode D4 receives the supply voltage Vdd1. The cathode of the diode D4 is connected to the input of an inverter comprising a P-channel MOS transistor MP2 and an N-channel MOS transistor MN2, and linked to the ground through a resistor R2. The input of the inverter is connected to the gates of the transistors MP2 and MN2. The source of the transistor MN2 is connected to the ground. The source of the transistor MP2 receives the supply voltage Vdd1. The drains of the transistors MP2 and MN2 supply at output of the circuit PCID a positive current injection detection signal LU2.

Figure 8:
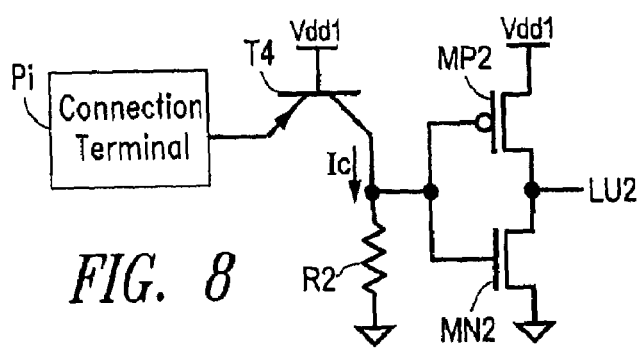
FIG. 8 is an equivalent wiring diagram of the detector circuit represented in FIG. 6.

The circuit PCID in FIG. 7 is equivalent to the circuit represented in FIG. 8. In the circuit in FIG. 8, the diodes D3 and D4 have been replaced by a bipolar transistor T4 of equivalent PNP type, the emitter of which is connected to the connection terminal Pi, the base of which receives the supply voltage Vdd1, and the collector of which is connected to the resistor R2 and to the gates of the transistors MP2 and MN2. In other words, the diodes D3 and D4 are sufficiently near one another to form junctions PN and NP of a bipolar transistor. The diode D4 that is thus added to detect a current injection, forms the collector-base junction of the transistor T4, while the diode D3 forms the emitter-base junction of the transistor T4.

The intensity of the current Ic circulating in the collector of the transistor T4, i.e., in the detection diode D4, varies according to the total current injected into the well of the integrated circuit by the connection terminal Pi. The law of variation of the intensity of the current Ic depends on the distance between the collector and the point of injection of the current, and on the shape and the dimensions of the collector. Due to these distance, shape and dimensional characteristics, the gain of the transistor T4 is typically lower than 1. The value of the resistor R2 is chosen according to the current intensity threshold to be detected. Typically, the value of the resistor R2 is of a few kilo-Ohms.

The transistors MP2 and MN2 are preferably designed so that the W/L ratio (channel width-to-length ratio) of the transistor MN2 is clearly greater than the ratio of the transistor MP2. Thus, the inverter made up of the transistors MP2 and MN2 switches when its input voltage is greater than or equal to Vtn, Vtn being the threshold voltage of the transistor MN2. The detection signal LU2 at output of the circuit PCID, normally on 1, thus goes to 0 if the following relation is confirmed:

$$R2 \cdot Ic \geq Vtn \tag{2}$$

i.e., if the current Ic collected by the diode D4 is greater than or equal to Vtn/R2.

Without this dimensioning constraint of the transistors MP2 and MN2, the switching threshold of the inverter made up of the transistors MP2 and MN2 depends on the voltage Vdd.

Figure 9:
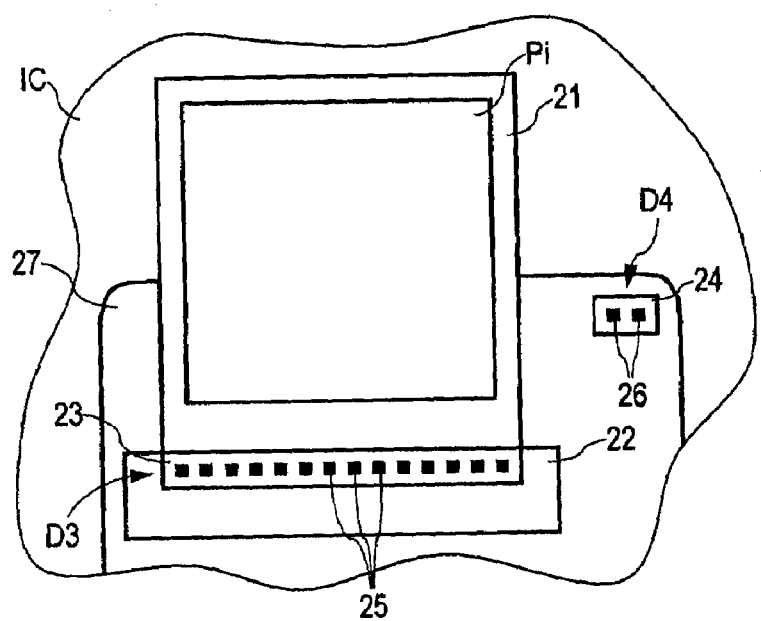
FIG. 9 is a simplified partial top view of the integrated circuit equipped with a detection means of the circuit represented in FIG. 7.

The notion of proximity of the diodes D3 and D4 is shown in FIG. 9 which represents in a top view a portion of the active face of the integrated circuit IC comprising the connection terminal Pi. The connection terminal Pi is produced by metallization 21 forming a contact pad deposited on the active face of the integrated circuit IC. The metallization 21 is connected to at least one highly P+-doped region 22 formed in an N-doped well 27. In FIG. 9, the contours of the contact pad Pi correspond to a zone of the active face of the integrated circuit not covered by a passivation insulator. The connection zone 23 of the zone 22 doped by the metallization 21 is linked to the latter by a plurality of contacts 25, particularly so as to enable a high current density. The interface between the doped zone 22 and the well 27 forms the diode D3 that is connected to the contact pad Pi.

The diode D4 is produced near the diode D3, by forming a highly P+-doped region 24 in the well 27, and by producing contacts 26 so as to be able to connect the diode to the rest of the circuit.

The distance between the diodes D3 and D4 is determined according to the duration of the current injection to be detected and to the speed of propagation of the loads thus injected into the integrated circuit.

It shall be noted that it is possible for the contact pads Pi of the integrated circuit IC to be associated only with a positive PCID or negative NCID current injection detector circuit depending on the configuration of the contact pad. In particular, if the contact pad Pi is only connected to an N+-doped region formed in the substrate, the pad Pi is only associated with a circuit NCID. If the contact pad Pi is only connected to a P+-doped region formed in an N-doped well, the pad Pi is only associated with a circuit PCID. Finally, if the contact pad Pi is connected to a P+-doped region formed in the substrate, and to a P+-doped region formed in an N-doped well, the contact pad is associated with both a circuit NCID and a circuit PCID.

Figure 10:
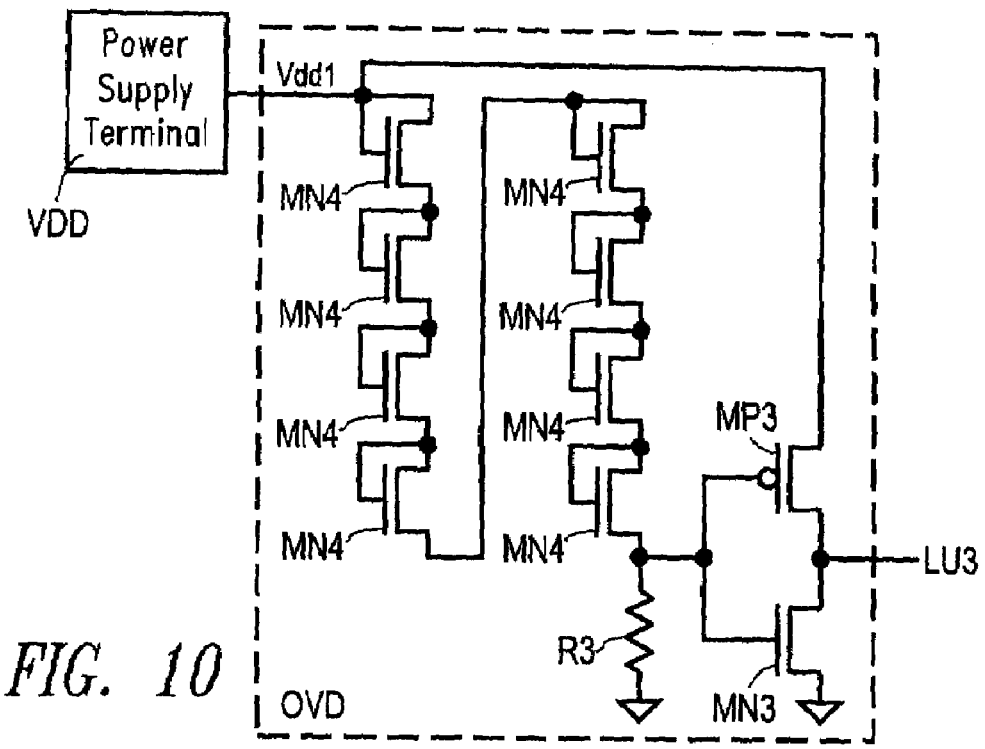
FIG. 10 is a wiring diagram of a detector circuit according to the present invention, for detecting an overvoltage on a power supply terminal of the integrated circuit.

FIG. 10 represents a detector circuit for detecting overvoltages OVD in a power supply connection terminal VDD of the integrated circuit IC. The circuit OVD comprises several diode-mounted MOS transistors MN4 (gate connected to the source) arranged in series between the connection terminal VDD and the ground through a resistor R3. The drain of the transistor connected to the resistor R3 is also connected to the input of an inverter comprising a P-channel MOS transistor MP3 and an N-channel MOS transistor MN3. The input of the inverter is connected to the gates of the transistors MP3 and MN3. The source of the transistor MN3 is connected to the ground. The source of the transistor MP3 receives the supply voltage Vdd. The drains of the transistors MP3 and MN3 supply a detection signal LU3 at output of the circuit OVD.

The transistors MN4 and the transistor MN3 determine a threshold voltage Vs above which the inverter made up of the transistors MP3 and MN3 switches and supplies a detection signal LU3, normally on 1, that changes to 0. The threshold voltage Vs is approximately equal to n+1 times the threshold voltage Vtn of an N-channel MOS transistor, n being the number of transistors MN4 arranged in series (Vs=(n+1).Vtn).

Figure 11:
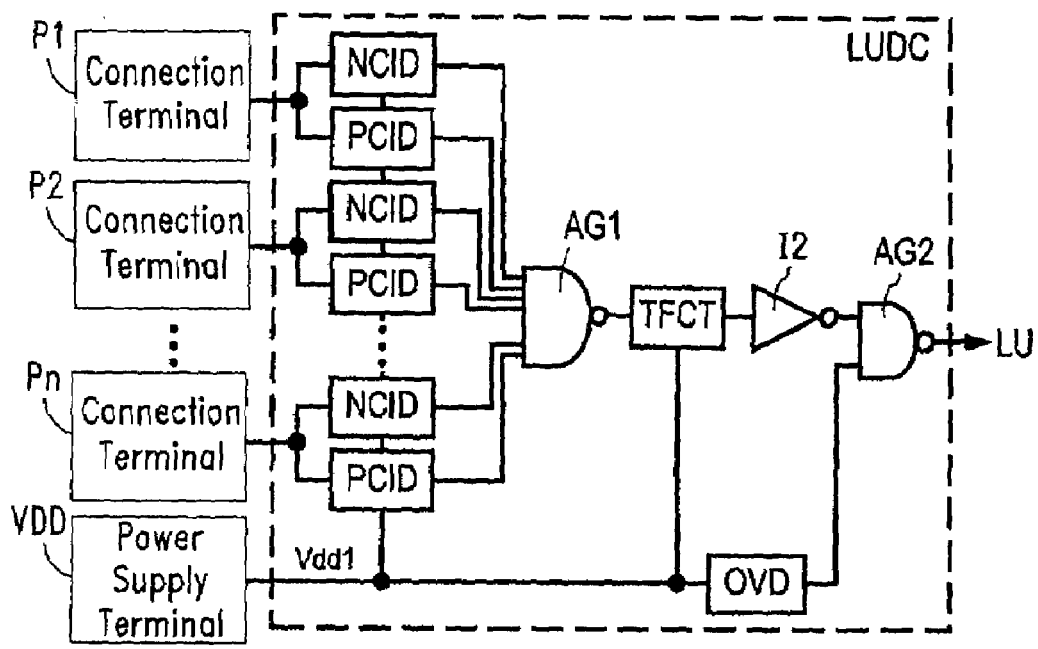
FIG. 11 represents in block form an alternative embodiment of the detection device represented in FIG. 3.

FIG. 11 represents an alternative embodiment of the detection device LUDC according to the present invention. Compared to the device represented in FIG. 3, the detection device LUDC represented in FIG. 11 comprises, in addition, a time delay circuit TFCT connected to the output of the gate AG1, an inverter I2 connected to the output of the circuit TFCT, and a NAND logic gate AG2 connected to the output of the inverter I2. The output of the gate AG2 supplies the detection signal LU. In addition, the output of the circuit OVD is connected, not to an input of the gate AG1, but to another input of the gate AG2.

In certain applications, transient current injections can occur and should not be considered to be latch-up conditions. Indeed, some of these conditions such as the injection of current into input and/or output terminals of the integrated circuit do not immediately generate a latch-up, due to the diffusion time of the minority loads transmitted from the diode D1 (or D3) to the detector circuit, which can be 200 μm from the diode. The circuit TFCT inserted at the output of the gate AG1 enables these transient conditions not to be detected. In other words, the changes to 0 of the signals LU1 and LU2 that have a shorter duration than the time delay of the circuit TFCT are not taken into account to modify the supply voltage Vdd1 of the integrated circuit.

On the other hand, overvoltages in the supply voltage Vdd1 very rapidly generate a breakdown by local avalanche multiplication effect. That is why the detection signal LU3 coming from the circuit OVD is immediately taken into account downstream from the circuit TFCT.

The duration of the time delay is chosen according to the distance between the connection terminal Pi and the detection diode D2, D4, to the distance in relation to the connection terminal Pi of the components to be protected of the integrated circuit, and to the speed of propagation of the loads in the substrate or in the well. In other words, the duration of the time delay, and the distance between the detection diode and the connection terminal determine the size of the protected zone of the integrated circuit around the connection terminal Pi. The longer the duration of the time delay is or the further the detection diode is from the connection terminal, the more the injected current propagates in the integrated circuit before a modification is applied to the supply voltage Vdd of the integrated circuit IC.

Figure 12:
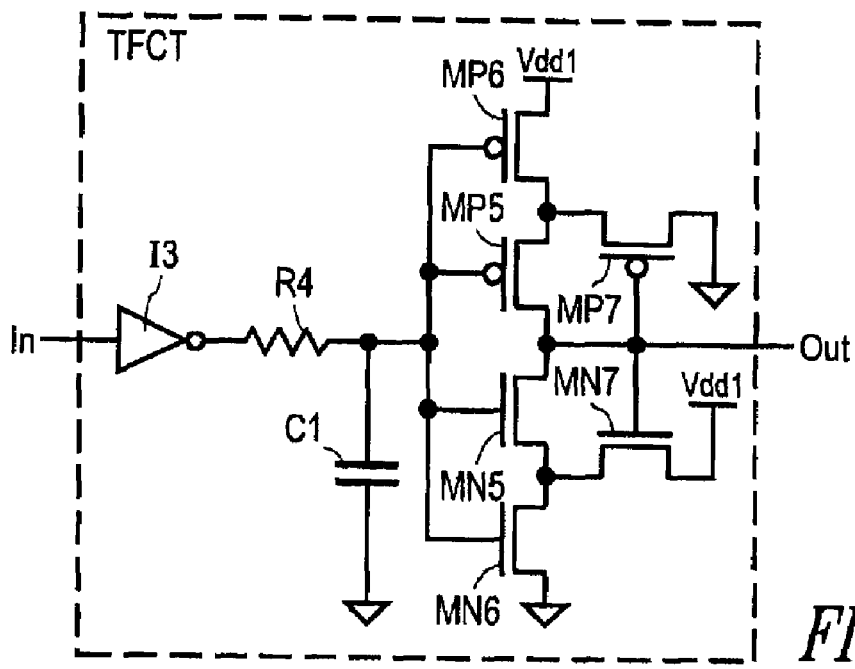
FIG. 12 is a wiring diagram of a time delay circuit of the detection device represented in FIG. 11, FIGS. 13 to 16 are wiring diagrams of several embodiments of supply voltage control circuits for controlling the supply voltage of the integrated circuit, of the protection device according to the present invention.

FIG. 12 represents an example of a time delay circuit TFCT. The circuit TFCT comprises a circuit RC, an inverter I3 connected between an input In of the circuit TFCT and the circuit RC, and a Schmitt trigger connected between the circuit RC and an output Out of the circuit TFCT.

The circuit RC comprises a resistor R4 comprising a first terminal connected to the output of the inverter I3, and a capacitor C1 connected between a second terminal of the resistor R2 and the ground.

The Schmitt trigger comprises two P-channel MOS transistors MP5, MP6, and two N-channel MOS transistors MN5, MN6. The gates of the transistors MP5, MP6, MN5, MN6 are connected to the second terminal of the resistor R4 and to the capacitor C1. The source of the transistor MP6 receives the supply voltage Vdd1. The source of the transistor MN6 is connected to the ground. The Schmitt trigger also comprises a transistor MP7 the source of which is connected to the drain of the transistor MP6 and to the source of the transistor MP5, and a transistor MN7 the source of which is connected to the source of the transistor MN5 and to the drain of the transistor MN6. The drains of the transistors MP5 and MN5 are connected to the output Out of the circuit TFCT and to the gates of the transistors MP7 and MN7.

The time constant of the circuit TFCT is in the order of R4.C1, and depends on the hysteresis of the Schmitt trigger.

It shall be noted that if the device LUDC detects successively and without discontinuity several temporary injections of current, the device will indicate a latch-up detection, despite the presence of the time delay circuit TFCT.

Figure 13:
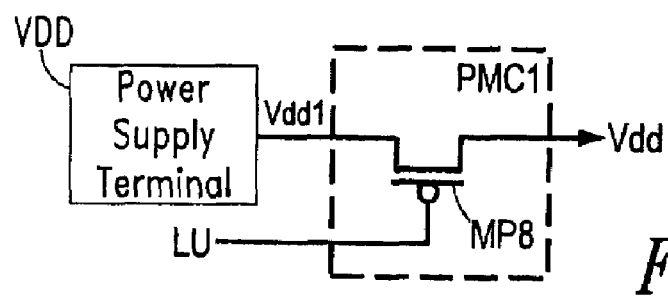

FIG. 13 represents a first embodiment of a control circuit for controlling the supply voltage of the integrated circuit. The circuit PMC1 represented in FIG. 13 comprises a P-channel MOS transistor MP8 operating like a switch connected between the connection terminal VDD and the supply voltage input Vdd of the integrated circuit. The transistor MP8 is controlled by the output signal LU of the detector circuit LUDC.

As soon as a latch-up condition is detected (signal LU on 1), the transistor MP8 cuts off the power supply of the integrated circuit IC. As soon as this condition disappears (signal LU on 0), the transistor MP8 restores the power supply of the integrated circuit.

Figure 14:
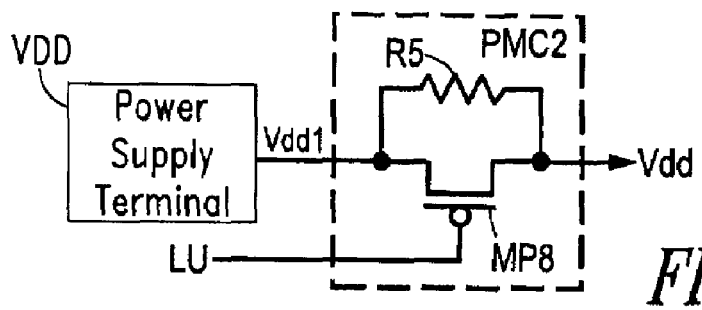

FIG. 14 represents a second embodiment of a control circuit for controlling the supply voltage of the integrated circuit. Compared to the circuit PMC1, the circuit PMC2 represented in FIG. 14 comprises, in addition, a resistor R5 connected between the drain and the source of the transistor MP8.

As soon as a latch-up condition is detected (signal LU on 1), the transistor MP8 goes off. The supply voltage Vdd is then supplied to the integrated circuit IC through the resistor R5. As soon as this condition disappears (signal LU on 0), the transistor MP8 short-circuits the resistor R5 and the integrated circuit then directly receives the supply voltage Vdd1 as supplied to the power supply connection terminal VDD (Vdd=Vdd1).

Figure 15:
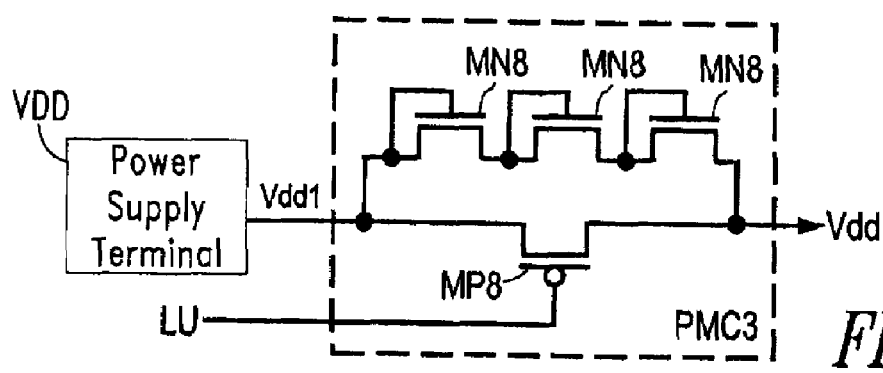

FIG. 15 represents a third embodiment of a control circuit for controlling the supply voltage of the integrated circuit. Compared to the circuit PMC2, the circuit PMC3 represented in FIG. 15 comprises, instead of the resistor R5, several diode-mounted N-channel MOS transistors MN8 arranged in series (three transistors MN8 in the example in FIG. 15).

As soon as a latch-up condition is detected (signal LU on 1), the transistor MP8 goes off. The supply voltage Vdd is then supplied to the integrated circuit IC through the transistors MN8 that step down the voltage Vdd of the threshold voltage Vtn of an N-channel transistor, multiplied by the number n of transistors MN8 (Vdd=Vdd1−n.Vtn). As soon as this condition disappears (signal LU on 0), the transistor MP8 short-circuits the transistors MN8 and the integrated circuit then receives the supply voltage Vdd1 as supplied to the power supply connection terminal VDD (Vdd=Vdd1).

Figure 16:
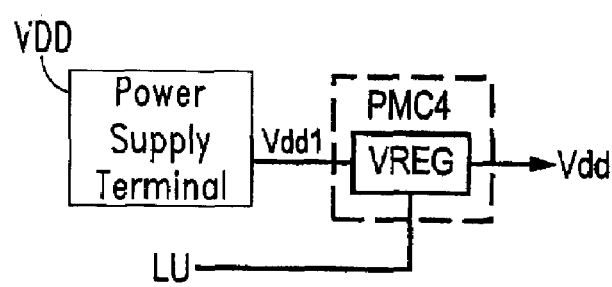

FIG. 16 represents a fourth embodiment of a control circuit for controlling the supply voltage of the integrated circuit. The circuit PMC4 represented in FIG. 16 comprises a voltage regulator VREG interposed between the connection terminal VDD and the supply voltage input Vdd of the integrated circuit. The regulator VREG is controlled by the detection signal LU.

As soon as a latch-up generating condition is detected (signal LU on 1), the voltage regulator VREG is designed to step down the supply voltage Vdd to a minimum value.

Certain integrated circuits are equipped with such a voltage regulator. The embodiment in FIG. 16 in fact provides for using the presence of such a voltage regulator to adjust the supply voltage of the integrated circuit to a minimum value when a latch-up condition is detected.

It will be understood by those skilled in the art that various alternative embodiments and applications of the present invention are possible. Thus, the present invention is not limited to an integrated circuit comprising both a latch-up condition detection device and a supply voltage control device for controlling the supply voltage of the integrated circuit. Indeed, the integrated circuit may comprise a latch-up condition detection device without any supply voltage control device, and supply the external environment with the detection signal LU that is taken into account by the external power supply of the integrated circuit.

Furthermore, the latch-up condition detection function can be produced without detecting any overvoltages on the power supply connection terminal of the integrated circuit, such that providing an overvoltage detector circuit OVD is optional.

The invention claimed is:

1. A method of protecting an integrated circuit against a latch-up condition, comprising:
    detecting a current in a reverse biased diode, the detected current varying as a function of a current injected into the connection terminal;
    delaying a modification of a supply voltage provided to the integrated circuit for a delay period of time that starts when the current detected is greater than a current intensity threshold; and
    modifying the supply voltage provided to the integrated circuit at an end of the delay period at least a first time from a first non-zero potential to a second non-zero potential, which is different from the first non-zero potential, if the current detected is still greater than the current intensity threshold at the end of the delay period, to prevent a latch-up condition from becoming permanently established.

2. A method according to claim 1, wherein the detected current varies as a function of a positive current injection into the connection terminal.

3. A method according to claim 1, wherein the detected current varies as a function of a negative current injection into the connection terminal.

4. A method according to claim 1, further comprising:
    detecting an overvoltage appearing in a power supply connection terminal of the integrated circuit; and
    modifying the supply voltage provided to the integrated circuit upon detection of the overvoltage in the power supply connection terminal without a respective delay period.

5. A method according to claim 1, wherein the modifying the supply voltage provided to the integrated circuit comprises stepping down the supply voltage provided to the integrated circuit while the latch-up condition is present, wherein the supply voltage provided to the integrated circuit after the modification thereof is non-zero.

6. A method according to claim 1, wherein the modifying the supply voltage provided to the integrated circuit comprises supplying the supply voltage provided to the integrated circuit through a resistor while the latch-up condition is present.

7. A device for protecting an integrated circuit, comprising:
    a latch-up condition detection device for detecting a latch-up condition, comprising a diode formed near a connection terminal of the integrated circuit, the diode configured to be reverse biased by a voltage from a power supply external to the integrated circuit, and a current detecting circuit for detecting a current passing through the reverse biased diode, the detected current varying as a function of a current injected into the connection terminal; and
    a supply voltage control device for controlling a supply voltage provided to circuits of the integrated circuit, to modify a parameter of the voltage from the external power supply if the current detected by the current detecting circuit is greater than a current intensity threshold such that the controlled supply voltage provided to circuits of the integrated circuit has a magnitude that is non-zero and less than a magnitude of the voltage from the external power supply, in order to prevent the latch-up from becoming permanently established.

8. A device according to claim 7, wherein the current passing through the reverse biased diode varies as a function of a negative current injected into a connection terminal of the integrated circuit.

9. A device according to claim 7, wherein the current passing through the reverse biased diode varies as a function of a positive current injected into a connection terminal of the integrated circuit.

10. A device according to claim 7, wherein the latch-up condition detection device comprises, for a connection terminal of the integrated circuit, a detector circuit for detecting a negative current injection into the connection terminal, and/or a detector circuit for detecting a positive current injection into the connection terminal.

11. A device according to claim 7, wherein the latch-up condition detection device selectively provides a latch-up condition signal indicating the latch-up condition if the latch-up condition is detected, and the latch-up condition detection device comprises a time delay circuit that delays providing the latch-up condition signal for a period of time, and only if the current detected is still greater than the current intensity threshold at the end of the period of time is the latch-up condition signal provided.

12. A device according to claim 11, wherein the latch-up condition detection device comprises a detector circuit for detecting an overvoltage appearing in a power supply connection terminal of the integrated circuit, wherein the latch-up condition detection device provides the latch-up condition signal without delay when the detector circuit detects overvoltage in the power supply connection terminal.

13. A device according to claim 7, wherein the supply voltage control device comprises a voltage step-down transformer for stepping down the voltage from the external power source while the latch-up condition is present.

14. A device according to claim 7, wherein the supply voltage control device comprises a resistor through which the controlled supply voltage is supplied to the integrated circuit while the latch-up condition is present.

15. A device according to claim 7, wherein the supply voltage control device comprises a voltage regulator that steps down the voltage from the external power source to a minimum value while the latch-up condition is present.

16. An integrated circuit comprising:
a protection device having a latch-up condition detection device and a supply voltage control device;
wherein the latch-up condition detection device is configured to detect a latch-up condition, the latch-up condition detection device including a diode formed near a connection terminal of the integrated circuit, the diode configured to be reverse biased by a voltage from a power supply external to the integrated circuit, and a current detecting circuit for detecting a current passing through the reverse biased diode, the detected current varying as a function of a current injected into the connection terminal; and
wherein the supply voltage control device is configured to control a supply voltage provided to circuits of the integrated circuit, to modify a parameter of the voltage from the external power supply if the current detected by the current detecting circuit is greater than a current intensity threshold such that the controlled supply voltage provided to circuits of the integrated circuit has a magnitude that is non-zero and less than a magnitude of the voltage from the external power supply, in order to prevent the latch-up from becoming permanently established.

17. A latch-up condition detection device for detecting a latch-up condition in an integrated circuit, comprising:
a detector circuit structured to detect a current injection into a connection terminal of the integrated circuit and selectively provide a latch-up condition signal, the detector circuit comprising,
a diode configured to be reverse biased by a power supply external to the integrated circuit, the diode formed near the connection terminal,
a current detecting circuit for detecting current passing through the reverse biased diode, and
a time delay circuit that delays providing the latch-up condition signal for a determined period of time staffing when the current detected is greater than a current intensity threshold, and only if the current detected is still greater than the current intensity threshold at the end of the period of time is the latch-up condition signal provided; and
a supply voltage control device configured to receive supply voltage from the external power supply at a first non-zero potential and to control a supply voltage provided to circuits of the integrated circuit at a second non-zero potential that is different from the first potential, if the time delay circuit provides the latch up condition signal to the supply voltage control device, in order to prevent the latch-up from becoming permanently established.

18. A device according to claim 17, wherein the current injection detector circuit is a negative current injection detector circuit that detects a negative current injection.

19. A device according to claim 17, wherein the current injection detector circuit is a positive current injection detector circuit that detects a positive current injection.

20. A device according to claim 17, comprising, for each connection terminal of the integrated circuit, a detector circuit for detecting a negative current injection into the connection terminal, and/or a detector circuit for detecting a positive current injection into the connection terminal.

21. A device according to claim 17 wherein the detector circuit comprises an overvoltage detector circuit for detecting an overvoltage appearing in a power supply connection terminal of the integrated circuit, wherein the detector circuit provides the latch-up condition signal without delay when the overvoltage detector circuit detects overvoltage in the power supply connection terminal of the integrated circuit.

22. An integrated circuit comprising a latch-up detection device having detector circuit and a supply voltage control device;
wherein the detector circuit is structured to detect a current injection into a connection terminal of the integrated circuit and selectively provide a latch-up condition signal, and the detector circuit includes,
a diode configured to be reverse biased by a power supply external to the integrated circuit, the diode formed near the connection terminal,
a current detecting circuit for detecting current passing through the reverse biased diode, and
a time delay circuit that delays providing the latch-up condition signal for a determined period of time staffing when the current detected is greater than a current intensity threshold, and only if the current detected is still greater than the current intensity threshold at the end of the period of time is the latch-up condition signal provided; and
wherein the supply voltage control device is configured to receive supply voltage from the external power supply at a first non-zero potential and to control a supply voltage provided to circuits of the integrated circuit at a second non-zero potential that is different from the first potential, if the time delay circuit provides the latch up condition signal to the supply voltage control device, in order to prevent the latch-up from becoming permanently established.

23. A method according to claim 1, wherein the diode is reverse-mounted near a parasitic diode or an ESD protection diode so as to form therewith a bipolar transistor.

24. A method according to claim 1, wherein the current intensity threshold is equal to Vt/R, Vt being a threshold voltage of a transistor of an inverter detecting the current in the diode and R being a resistor connected to the diode.

25. A method according to claim 1, comprising:
reverse biasing a second diode formed near the connection terminal of the integrated circuit with the supply voltage;
detecting a second current in the second diode, the detected second current varying as a function of the current injected into the connection terminal; and
modifying the supply voltage parameter of the integrated circuit if the second current is greater than a second current intensity threshold.

26. A device according to claim 7, wherein the diode is reverse-mounted near a parasitic diode or an ESD protection diode so as to form therewith a bipolar transistor.

27. A device according to claim 7, wherein the current detecting circuit comprises an inverter, the current intensity threshold being equal to Vt/R, Vt being a threshold voltage of a transistor of the inverter and R being a resistor connected to the diode.

28. A device according to claim 7, wherein the latch-up condition detection device further comprises a second diode formed near the connection terminal of the integrated circuit, the second diode having a terminal biasable by the supply voltage of the integrated circuit, and a second current detecting circuit for detecting a second current passing through the second diode, the detected second current varying as a function of the current injected into the connection terminal, and wherein the supply voltage control device modifies the parameter of the supply voltage of the integrated circuit if the second current detected by the second current detecting circuit is greater than a second current intensity threshold.

29. A device according to claim 17, wherein the diode is reverse-mounted near a parasitic diode or an ESD protection diode so as to form therewith a bipolar transistor.

30. A device according to claim 17, wherein the current detecting circuit comprises an inverter, the current intensity threshold being equal to Vt/R, Vt being a threshold voltage of a transistor of the inverter and R being a resistor connected to the diode.

31. A method according to claim 1, wherein the modifying the supply voltage provided to the integrated circuit comprises supplying the supply voltage provided to the integrated circuit through at least one transistor while the latch-up condition is present.

32. A device according to claim 7, the supply voltage control device comprises a resistor through which the controlled supply voltage is supplied to the integrated circuit while the latch-up condition is present.

33. A device according to claim 16, wherein the supply voltage control device comprises a resistor through which the controlled supply voltage is supplied to the integrated circuit while the latch-up condition is present.

34. A device according to claim 16, wherein the supply voltage control device comprises a voltage step-down transformer for stepping down the voltage from the external power source while the latch-up condition is present.

35. A device according to claim 17, wherein the supply voltage control device comprises a resistor through which the controlled supply voltage is supplied to the integrated circuit while the latch-up condition is present.

36. A device according to claim 17, wherein the supply voltage control device comprises a voltage step-down transformer for stepping down the voltage from the external power source while the latch-up condition is present.

* * * * *

UNITED STATES PATENT AND TRADEMARK OFFICE
CERTIFICATE OF CORRECTION

PATENT NO. : 7,692,906 B2  
APPLICATION NO. : 11/626086  
DATED : April 6, 2010  
INVENTOR(S) : François Tailliet Page 1 of 1

It is certified that error appears in the above-identified patent and that said Letters Patent is hereby corrected as shown below:

Title Page Item 30
Should read, --Jan. 24, 2006 (FR)....06/00607--.

Column 13
Claim 17, Lines 56-57, "conditional signal for a determined period of time staffing when the current detected is greater than a current" should read as, --condition signal for a determined period of time starting when the current detected is greater than a current--.

Column 14
Claim 22, Lines 36-37, "condition signal for a determined period of time staffing when the current detected is greater than a current" should read as, --condition signal for a determined period of time starting when the current detected is greater than a current--.

Signed and Sealed this
Twenty-eighth Day of December, 2010

David J. Kappos
*Director of the United States Patent and Trademark Office*